(12) United States Patent
Nakamura et al.

(10) Patent No.: US 10,408,874 B2
(45) Date of Patent: Sep. 10, 2019

(54) LIGHT SOURCE DEVICE AND INSPECTION DEVICE

(71) Applicant: HAMAMATSU PHOTONICS K.K., Hamamatsu-shi, Shizuoka (JP)

(72) Inventors: Tomonori Nakamura, Hamamatsu (JP); Mitsunori Nishizawa, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 5 days.

(21) Appl. No.: 15/576,389

(22) PCT Filed: May 10, 2016

(86) PCT No.: PCT/JP2016/063864
§ 371 (c)(1),
(2) Date: Nov. 22, 2017

(87) PCT Pub. No.: WO2016/194556
PCT Pub. Date: Dec. 8, 2016

(65) Prior Publication Data
US 2018/0156860 A1 Jun. 7, 2018

(30) Foreign Application Priority Data
May 29, 2015 (JP) ................. 2015-110187

(51) Int. Cl.
*G01R 31/265* (2006.01)
*G01R 31/302* (2006.01)
(Continued)

(52) U.S. Cl.
CPC ..... *G01R 31/2656* (2013.01); *G01R 31/2601* (2013.01); *G01R 31/302* (2013.01);
(Continued)

(58) Field of Classification Search
USPC ........ 324/501, 750.01–750, 3, 750.23, 76.36
See application file for complete search history.

(56) References Cited

U.S. PATENT DOCUMENTS

| 6,078,422 A | 6/2000 | Kosaka et al. | |
| 2005/0012988 A1* | 1/2005 | Kim | H01S 5/50 359/344 |

(Continued)

FOREIGN PATENT DOCUMENTS

| CN | 1380758 A | 11/2002 |
| CN | 1591154 A | 3/2005 |

(Continued)

OTHER PUBLICATIONS

International Preliminary Report on Patentability dated Dec. 14, 2017 for PCT/JP2016/063864.

(Continued)

*Primary Examiner* — Vincent Q Nguyen
(74) *Attorney, Agent, or Firm* — Drinker Biddle & Reath LLP

(57) ABSTRACT

A light source device includes a light source that generates incoherent light, and an optical amplifier having gain characteristics indicating a gain at each wavelength, which receives the incoherent light output by the light source as input light, and outputs amplified light obtained by amplifying the input light, and a central wavelength of an intensity distribution indicating an intensity at each wavelength of the input light is a wavelength longer than a central wavelength of the gain characteristics indicating a gain at each wavelength of the optical amplifier.

11 Claims, 19 Drawing Sheets

(51) Int. Cl.
  *H01S 5/50* (2006.01)
  *G01R 31/26* (2014.01)
  *G01R 31/311* (2006.01)

(52) U.S. Cl.
  CPC .............. *G01R 31/311* (2013.01); *H01S 5/50* (2013.01); *H01S 5/5027* (2013.01); *H01S 5/5045* (2013.01)

(56) References Cited

U.S. PATENT DOCUMENTS

| | | | |
|---|---|---|---|
| 2005/0047727 A1 | 3/2005 | Shin et al. | |
| 2006/0045542 A1* | 3/2006 | Lee | H04B 10/572 398/195 |
| 2013/0070793 A1 | 3/2013 | Sasaki | |
| 2013/0286468 A1* | 10/2013 | Akasaka | H01S 3/06754 359/334 |

FOREIGN PATENT DOCUMENTS

| | | |
|---|---|---|
| CN | 103563064 A | 2/2014 |
| CN | 104300360 A | 1/2015 |
| JP | 2009-049123 A | 3/2009 |
| JP | 2012-247397 A | 12/2012 |
| JP | 2013-65713 A | 4/2013 |
| WO | WO 2014/028013 A1 | 2/2014 |

OTHER PUBLICATIONS

Yamatoya, T., et al., "Noise Suppression of Spectrum-Sliced Light Using Semiconductor Optical Amplifiers," Electronics and Communications in Japan, Part 2, vol. 86, No. 2, 2003, pp. 28-35.

Kwong N. S., "High-power, broad-band 1550 nm light source by tandem combination of a superluminescent diode and an Er-doped fiber amplifier", IEEE Photonics Technology Letters, IEEE Service Center, Piscataway, NJ, US, vol. 4, No. 9, Sep. 9, 1992, p. 996-p. 999, XP011410527.

K-Y Liou et al, "Operation of an LED with a single-mode semiconductor amplifier as a broad-band 1.3- m transmitter source", IEEE Photonics Technology Letters, IEEE Service Center, Piscatway, NJ, US, vol. 7, No. 9, Sep. 9, 2009, p. 1025-p. 1027, XP011427455.

* cited by examiner

LIGHT SOURCE DEVICE AND INSPECTION DEVICE

TECHNICAL FIELD

An aspect of the present invention relates to a light source device and an inspection device.

BACKGROUND ART

In the related art, a light source that outputs incoherent light (hereinafter often referred to as an incoherent light source), such as a super luminescent diode (SLD), is used, as a light source for an electoro-optical probing (EOP) device, an electro-optical frequency mapping (EOFM) device, and a magneto-optical frequency mapping (MOFM) device regarding fault analysis of a semiconductor or the like (for example, see Patent Literature 1). Such incoherent light has a merit that it is more difficult for interference fringes to be generated as compared with laser light. On the other hand, an incoherent light source is generally inferior to a laser light source in terms of an SN ratio.

For example, Non-Patent Literature 1 discloses a light source device in which an SLD that is an incoherent light source and a semiconductor optical amplifier (SOA) that is an optical amplifier are combined. In the semiconductor optical amplifier, when the power of input light increases, carriers stored in an active layer are consumed in order to amplify the input light, and a gain is decreased. In a state in which the gain is decreased (gain saturation), light amplification characteristics of the semiconductor optical amplifier becomes nonlinear. By amplifying the input light in a region in which such amplification characteristics are nonlinear, it is possible to suppress the intensity of noise in the input light.

CITATION LIST

Patent Literature

[Patent Literature 1] Japanese Unexamined Patent Publication No. 2012-247397

Non-Patent Literature

[Non-Patent Literature 1] Noise Suppression of Spectrum-Sliced Light Using Semiconductor Optical Amplifiers (Electronics and Communications in Japan, Part 2, Vol. 86, No. 2, 2003 pp. 28-35 (Translated from Denshi Joho Tsushin Gakkai Ronbunshi, Vol. J85-C, No. 6, June 2002, pp. 417-423), Takeshi Yamatoya, Fumio Koyama)

SUMMARY OF INVENTION

Technical Problem

By combining the SLD with the semiconductor optical amplifier as in the light source device disclosed in Non-Patent Literature 1, it is possible to reduce noise (for example, a temporal fluctuation in intensity) derived from the SLD that generates light. However, in the light source device, since noise regarding the semiconductor optical amplifier that amplifies the light is generated, the noise of the entire light source device is not sufficiently reduced.

An aspect of the present invention has been made in view of the above circumstances, and an object thereof is to reduce noise in a light source device using an incoherent light source, and an inspection device.

Solution to Problem

A light source device according to an aspect of the present invention includes a light source that generates incoherent light; and an optical amplifier having gain characteristics indicating a gain at each wavelength, the optical amplifier receiving the incoherent light as input light and outputting amplified light obtained by amplifying an intensity of the input light. In the light source device, a central wavelength of an intensity distribution indicating the intensity at each wavelength of the input light is a wavelength longer than a central wavelength of the gain characteristics.

Excitation charge that does not contribute to amplification of light in the optical amplifier emits energy as spontaneous emission light. The noise is estimated to be generated due to such spontaneous emission light. Therefore, it is conceivable that noise caused by the spontaneous emission light can be reduced by reducing the amount of the charge becoming the spontaneous emission light. In this light source device, the central wavelength of the intensity distribution of the input light of the optical amplifier is longer than the central wavelength of the gain characteristics of the optical amplifier. In the optical amplifier, noise may be considered to be generated due to low energy charge not contributing to the amplification of the input light becoming spontaneous emission light. That is, as the amount of the low energy charge on the long wavelength side that does not contribute to the amplification of the input light increases, the noise of the input light is estimated to increase. In this regard, in this light source device, the central wavelength of the intensity distribution of the input light of the optical amplifier is longer than the central wavelength of the gain characteristics. Normally, the central wavelength of the input light of the optical amplifier is set to match the central wavelength of the gain characteristics. However, by setting the central wavelength of the input light to be shifted to the long wavelength side as described above, it becomes easy for low energy charge on the long wavelength side in the optical amplifier to be used for amplification as compared with a case in which the central wavelength is set to match the central wavelength of the gain characteristics. Accordingly, it possible to reduce the charge on the long wavelength side that does not contribute to the amplification of the input light, and to reduce the noise of the amplified light output from the optical amplifier.

Further, the amplified light may include a saturation wavelength region having an intensity in a state in which amplification in the optical amplifier has become saturated. In this light source device, when light with an intensity equal to or higher than a certain intensity is included in the input light, the gain of the optical amplifier is reduced, amplification characteristics becomes nonlinear, and noise (for example, a temporal fluctuation in intensity) included in the input light is suppressed. In this case, the amplified light output from the optical amplifier includes a saturation wavelength region having an intensity in a state in which amplification in the optical amplifier has become saturated. Accordingly, it is possible to relatively reduce the noise in the amplified light.

Further, the wavelength on the long wavelength side of an N value (0<N<1) of the intensity distribution of the input light may be a wavelength longer than the wavelength on the long wavelength side of the N value of the gain characteristics. Accordingly, since the wavelength of the input light is set to be further shifted to the long wavelength side of the gain characteristics, it is possible to further reduce the noise of the amplified light.

Further, the saturation wavelength region in the amplified light may be wider than a wavelength region that is not a saturation wavelength region. The amplified light in this state is amplified light in which a wavelength region in a saturated state is wide and an amount of charge that does not contribute to amplification in the optical amplifier is small. Therefore, it is possible to further reduce the noise of the amplified light.

Further, the light source device may further include a filter that receives the incoherent light output from the light source and reduces a peak value of the intensity distribution for a wavelength of the incoherent light output from the light source. Accordingly, a peak of the intensity distribution can be suppressed, incoherent light with a widened wavelength width can be used as the input light of the optical amplifier, and it is easy for low energy charge on the long wavelength side of the gain characteristics to contribute to the amplification.

Further, the light source device may further include a light adjustment means that adjusts the intensity of the amplified light output from the optical amplifier. Accordingly, the intensity of the amplified light can be adjusted by the light adjustment means after the amplification, and light with a desired intensity can be obtained.

Further, the optical amplifier may be a semiconductor optical amplifier. By using the semiconductor optical amplifier, it is possible to further reduce noise of the amplified light.

An inspection device according to an aspect of the present invention is an inspection device that inspects a semiconductor device using optical probing, and includes the above-described light source device; an optical system that receives the amplified light output from the light source device and irradiates a selected region on the semiconductor device with the amplified light; and a light detection unit that receives the amplified light reflected from the semiconductor device and outputs a detection signal. Thus, the above-described light source device can be applied to an inspection device that inspects a semiconductor device using optical probing, and accuracy of the inspection can be improved by reducing the noise of the light.

An inspection device according to an aspect of the present invention is an inspection device that inspects a semiconductor device using magneto-optical probing, and includes a magneto-optical crystal arranged to face the semiconductor device; the above-described light source device; an optical system that receives the amplified light output from the light source device and irradiates a selected region of the magneto-optical crystal with the amplified light; and a light detection unit that detects the light reflected from the magneto-optical crystal. Thus, the above-described light source device can be applied to an inspection device that inspects a semiconductor device using optical probing, and accuracy of the inspection can be improved by reducing the noise of the light.

Further, the inspection device may further include a signal application unit that applies a test signal to the semiconductor device; and an analysis unit that receives the detection signal and analyzes the detection signal. Accordingly, it is possible to perform inspection of the semiconductor device in a driven state.

Advantageous Effects of Invention

According to an aspect of the present invention, it is possible to reduce noise in the light source device using an incoherent light source and the inspection device.

DESCRIPTION OF EMBODIMENTS

Hereinafter, embodiments of the present invention will be described in detail with reference to the drawings. In each drawing, the same or corresponding portions are denoted with the same reference signs, and repeated description will be omitted.

[First Embodiment]

Figure 1:
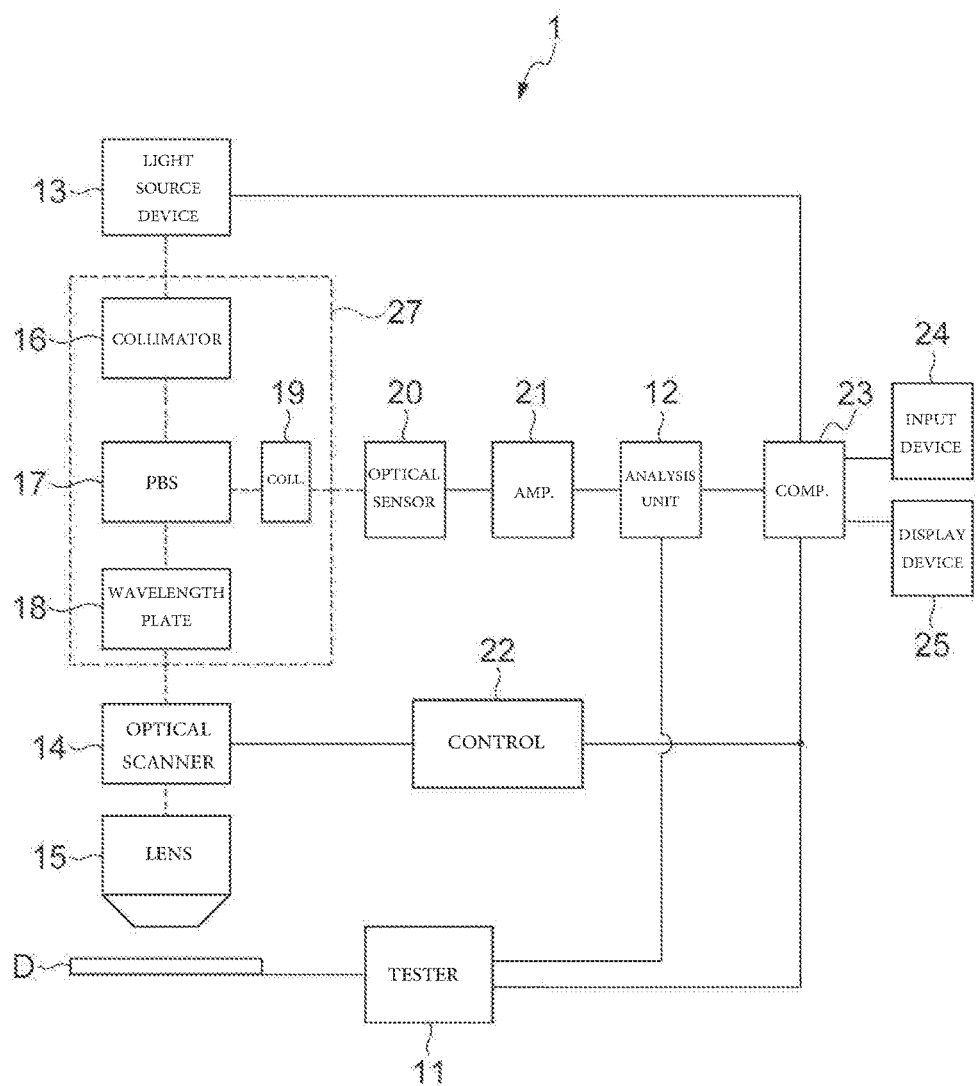
FIG. 1 is a configuration diagram of an inspection device according to a first embodiment of the present invention.

As illustrated in FIG. 1, an inspection device 1 (a semiconductor inspection device) according to a first embodiment is a device for inspecting a semiconductor device D that is a measurement target and is a device under test (DUT), such as specifying an abnormality occurrence place in the semiconductor device D. More specifically, the inspection device 1 specifies a fault position using a beam probing technology called EOP or EOFM. Examples of the semiconductor device D include an integrated circuit having a PN junction such as a transistor (for example, a small-scale integrated circuit (SSI: Small Scale Integration), a medium scale integrated circuit (MSI: Medium Scale Integration), a large scale integrated circuit (LSI: Large Scale Integration), a very large scale integrated circuit (VLSI: Very Large Scale Integration), an ultra large scale integrated circuit (ULSI: Ultra Large Scale Integration), a giga scale integrated circuit (GSI: Giga Scale Integration)), an MOS transistor for a high current/high voltage, a bipolar transistor, and a power semiconductor device (power device). Further, the measurement target may be not only the semiconductor device D, but also, for example, a thin film transistor (TFT) such as an amorphous transistor, a polysilicon transistor, or an organic transistor formed on a glass surface, a package including a semiconductor device, or a composite substrate.

Further, a tester 11 (signal application unit) is electrically coupled to the semiconductor device D via a device control cable. The tester 11 is operated by a power supply (not illustrated) and repeatedly applies a predetermined test signal (drive signal) to the semiconductor device D. The test signal is, for example, a modulation current signal. The tester 11 need not necessarily apply a modulation current signal, and may apply a continuous wave (CW) current signal that causes pulse light according to a detected frequency to be generated. A modulation voltage signal or the like may be applied as the test signal. The tester 11 is electrically coupled to a frequency analysis unit 12 by a timing signal cable.

The inspection device 1 includes a light source device 13. The light source device 13 is operated by a power source (not illustrated), and outputs incoherent light with which the semiconductor device D is irradiated. A wavelength of the incoherent light is equal to or greater than 530 nm and is, for example, 1064 nm. The light output from the light source device 13 is guided to a light splitting optical system 27 via a deflection preserving single mode optical coupler (not illustrated) and a polarization preserving single mode optical fiber for probe light. The light source device 13 and the light splitting optical system 27 are optically coupled. Details of the light source device 13 will be described below.

The light splitting optical system 27 includes collimators 16 and 19, a deflection beam splitter (hereinafter referred to as a PBS) 17, and a λ/4 wavelength plate 18. These are optically coupled. When the semiconductor device D is irradiated with the light from the light source device 13 via an optical scanner 14 (which will be described below), the light from the light source device 13 is input to the PBS 17 via the collimator 16. The PBS 17 is set to transmit light having a deflection component of 0° and reflect light having a deflection component of 90°. Further, the PBS 17 is set according to polarization of light from the collimator 16. Therefore, the PBS 17 transmits the light from the collimator 16. The light having the deflection component of 0° transmitted through the PBS 17 is transmitted through the λ/4 wavelength plate 18 and input to the optical scanner 14. The light is radiated to the semiconductor device D via an objective lens 15 (described below). The light splitting optical system 27 is also optically coupled to the optical scanner 14 and the objective lens 15.

Reflected light (return light) from the semiconductor device D is input to the λ/4 wavelength plate 18 via the objective lens 15 and the optical scanner 14. The reflected light (return light) is transmitted through the λ/4 wavelength plate 18 to become circularly polarized light, and a deflection component is titled by 90°. The reflected light having the deflection component of 90° is reflected by the PBS 17 and input to an optical sensor 20 via the collimator 19.

The optical scanner 14 includes, for example, an optical scanning element such as a galvanometer mirror or a micro electro mechanical system (MEMS) mirror. Further, the objective lens 15 condenses the light guided by the optical scanner 14 onto the semiconductor device D. The optical scanner 14 and the objective lens 15 form an irradiation optical system (optical system) that irradiates (scans) a selected region on the semiconductor device D with the light (amplified light) output from the light source device 13. The selected region is a spot or an area selected by a user. When an area is selected as the selected region by the user, the area is two-dimensionally scanned by the optical scanner 14 controlled by the control device 22 that receives an instruction of a computer 23. When the spot is selected as the selected region by the user, the light is controlled to be radiated to the spot by the control device 22 that receives an instruction from the computer 23. The objective lens 15 is configured to be switchable between a low magnification objective lens (for example, 5 times) and a high magnification objective lens (for example, 50 times) by a turret (not illustrated) or the like.

The optical sensor 20 is, for example, a photodiode, an avalanche photodiode, a photomultiplier tube, or an area image sensor. The optical sensor 20 receives reflected light from the semiconductor device D and outputs a detection signal. That is, the optical sensor 20 is a light detection unit (photodetector) that detects light reflected by the semiconductor device D to which the test signal has been applied according to the light radiated from the optical scanner 14. The detection signal output from the optical sensor 20 is amplified by an amplifier 21 and input as an amplified signal to the frequency analysis unit 12. The frequency analysis unit 12 is an analysis unit (analyzer) that receives the detection signal and analyzes the detection signal. Specifically, the frequency analysis unit 12 extracts a measurement frequency component in the amplified signal and outputs the extracted signal as an analysis signal. The measurement frequency is set, for example, based on a modulation frequency of a modulation current signal that is applied to the semiconductor device D. As the frequency analysis unit 12, a lock-in amplifier, a spectrum analyzer, a digitizer, a cross domain analyzer (registered trademark), or the like may be used.

The analysis signal output by the frequency analysis unit 12 is input to the computer 23. The computer 23 is, for example, a PC. An input device 24 such as a keyboard or a mouse to which measurement conditions and the like are input from the user, and a display device 25 such as a monitor for showing a measurement result or the like to the user are coupled to the computer 23. The computer 23 includes a processor. The computer 23 executes, through the processor, a function of controlling the light source device 13, the control device 22, the tester 11, the optical sensor 20, the frequency analysis unit 12, or the like, and a function of creating a waveform (analysis image) based on the analysis signal from the frequency analysis unit 12. The user can search for a fault position in the analysis image.

Figure 2:
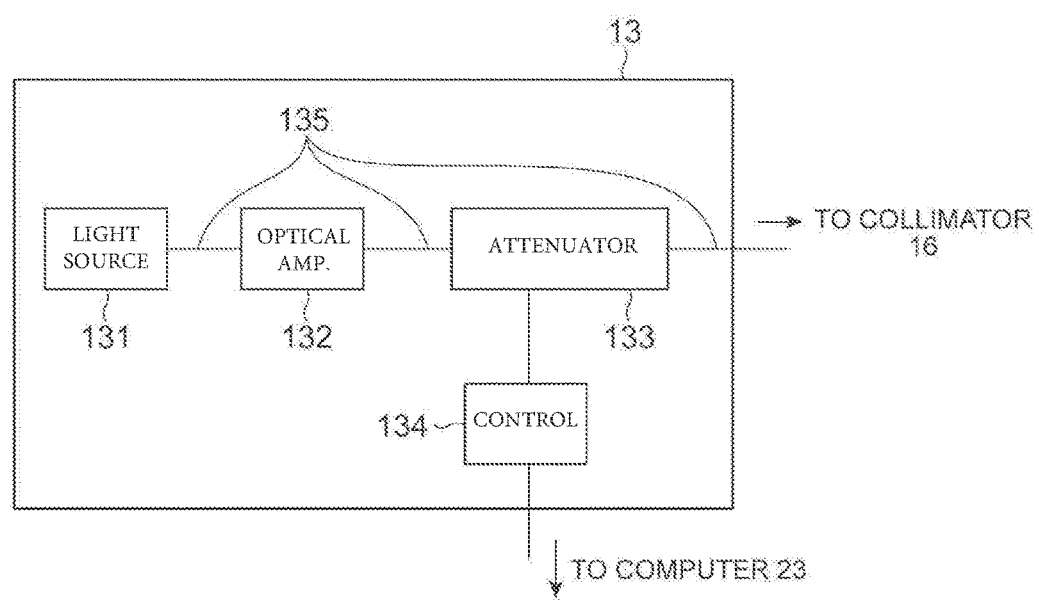
FIG. 2 is a configuration diagram of a light source device included in the inspection device of FIG. 1.

Next, details of the light source device 13 will be described with reference to FIGS. 2 to 8. As illustrated in FIG. 2, the light source device 13 includes a light source 131, an optical amplifier 132, a variable attenuator 133 (light modulation means), and a control device 134. The light source 131, the optical amplifier 132, and the variable attenuator 133 are optically coupled by an optical fiber cable 135. The variable attenuator 133 and the control device 134 are electrically coupled via a cable.

The light source 131 generates and outputs incoherent light. The light source 131 may be a light source that generates incoherent light. For example, a super luminescent diode (SLD), an amplified spontaneous emission (ASE) light source, a light emitting diode (LED), or the like can be used. The optical amplifier 132 has gain characteristics indicating a gain (amplification rate) for each wavelength. The optical amplifier 132 is an optical amplifier that receives the incoherent light output by the light source 131 as input light, amplifies an intensity of the input light, and outputs the amplified light. The optical amplifier 132 is, for example, a semiconductor optical amplifier, an optical fiber amplifier, or a booster optical amplifier. The variable attenuator 133 is a light adjustment means that adjusts the intensity of the light output from the optical amplifier 132. The adjustment of intensity of the light in the variable attenuator 133 is controlled by the control device 134 that has received an instruction of the computer 23. The variable attenuator 133 outputs the light after the intensity adjustment to the collimator 16 of the light splitting optical system 27.

The input light that is input to the optical amplifier 132 includes light with an intensity at which the optical amplifier 132 is saturated in a gain. For the gain of the optical amplifier 132, a specific value is determined for each wavelength according to characteristics of an element (optical amplifier). On the other hand, an upper limit of the intensity of light that can be output from the optical amplifier 132 is also determined. Therefore, when the intensity of the input light becomes greater than a certain value, light amplification is suppressed in the optical amplifier 132, and the optical amplifier cannot amplify the light according to a determined gain. In this case, even when the intensity of the input light of the optical amplifier 132 increases, the intensity of the amplified light becomes constant, and light amplification characteristics of the optical amplifier 132 become nonlinear. A state in which the light amplification characteristics of the optical amplifier 132 are nonlinear is a state in which the above-described optical amplifier 132 is saturated in a gain as described above. The gain saturation at a certain wavelength in the optical amplifier 132 refers to a state in which all charge capable of contributing to the amplification of the light at the certain wavelength has been used up and the light amplification is suppressed.

Figure 3:
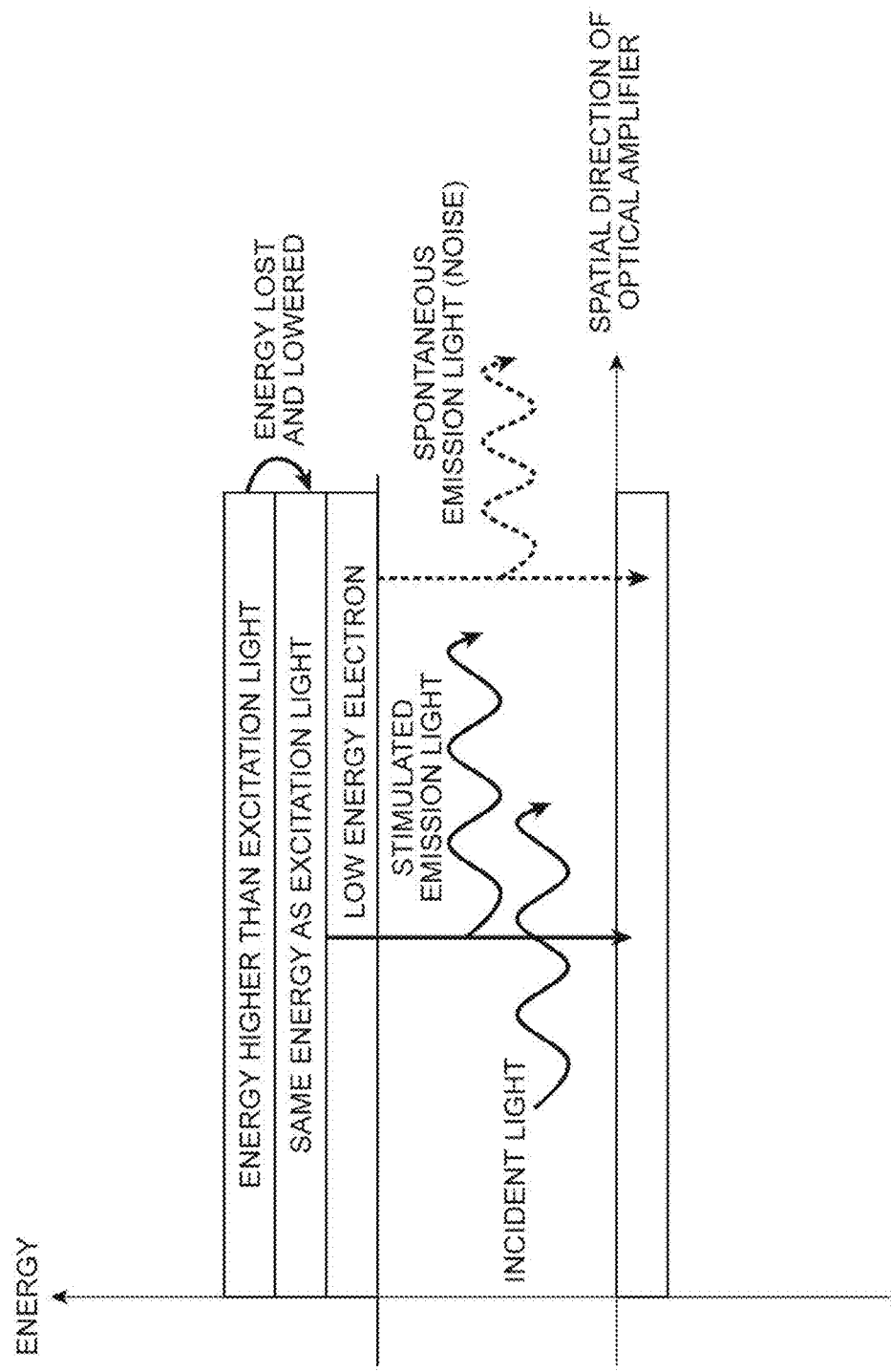
FIG. 3 is a diagram illustrating a noise generation mechanism in a semiconductor optical amplifier.

The charge contributing to the amplification of the light will be described in greater detail. FIG. 3 illustrates electrons in three energy bands in the semiconductor optical amplifier that is an example of the optical amplifier 132, that is, electrons in an energy band higher than that of excitation light (input light), electrons in the same energy band as that of the input light, and electrons in an energy band lower than that that of input light. A vertical direction in FIG. 3 is a height of energy, and a horizontal direction indicates a spatial direction inside the semiconductor optical amplifier. The light passes through the semiconductor amplifier from left to right. When light is input, electrons in the same energy band as that of the input light are emitted in a stimulated manner, and the input light is amplified. When electrons in the same energy band as that of the input light are used for stimulated emission, the energy of electrons in the energy band higher than that of the input light decreases, and the electrons become electrons in the same energy band as that of the input light. Therefore, electrons of which the energy has been degraded are emitted in a stimulated manner and are used for amplification of the input light. On the other hand, electrons in the energy band lower than that of the input light, that is, electrons on the long wavelength side with respect to the input light cannot be emitted in a stimulated manner and are not used for amplification of input light. Such electrons are estimated to be spontaneous emission light that is emitted by itself. The spontaneous emission light is light that is not related to the amplification of the light, and may be noise in the optical amplifier 132. There is also a semiconductor optical amplifier that uses dielectric emission of holes rather than dielectric emission of electrons. Further, noise may be generated by the same phenomenon in an optical amplifier other than a semiconductor optical amplifier.

In view of the above, the light source 131 generates incoherent light so that a central wavelength of an intensity distribution for each wavelength of the input light input to the optical amplifier 132 is longer than a central wavelength of gain characteristics indicating a gain at each wavelength of the optical amplifier 132. That is, a central wavelength of the intensity distribution of the input light input to the optical amplifier 132 is set to be shifted to the long wavelength side with respect to the gain characteristics on the premise that charge on the long wavelength side with respect to the input light becoming spontaneous emission light is one cause of noise generation in the optical amplifier 132. Here, the central wavelength refers to a wavelength at a central value of a full width at half maximum of the intensity distribution or the gain characteristics.

Figure 4:
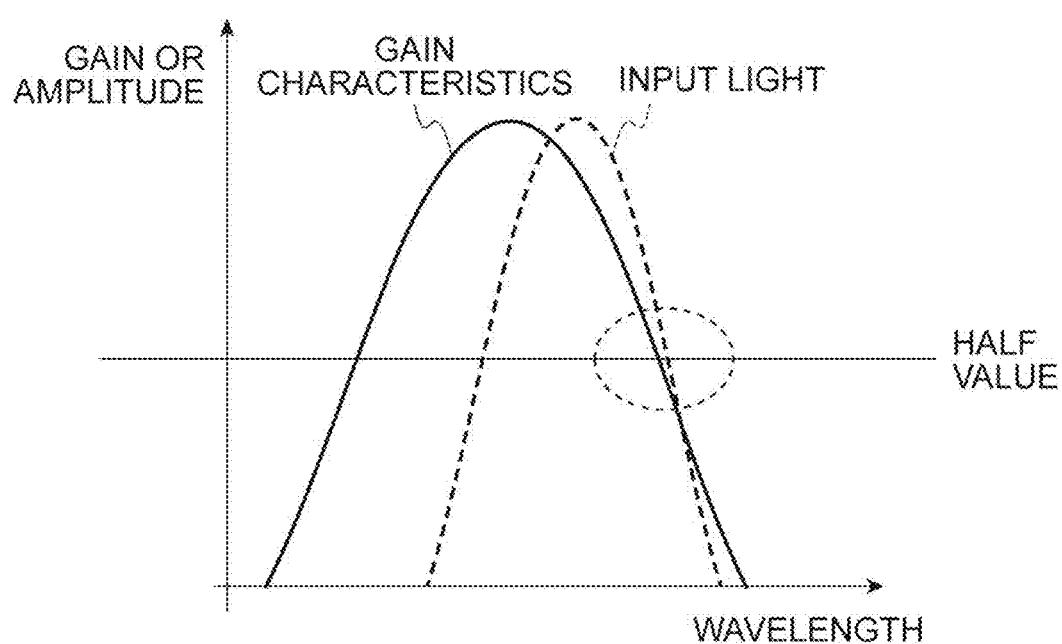
FIG. 4 is a diagram illustrating gain characteristics and an intensity of input light for each wavelength.
Figure 6:
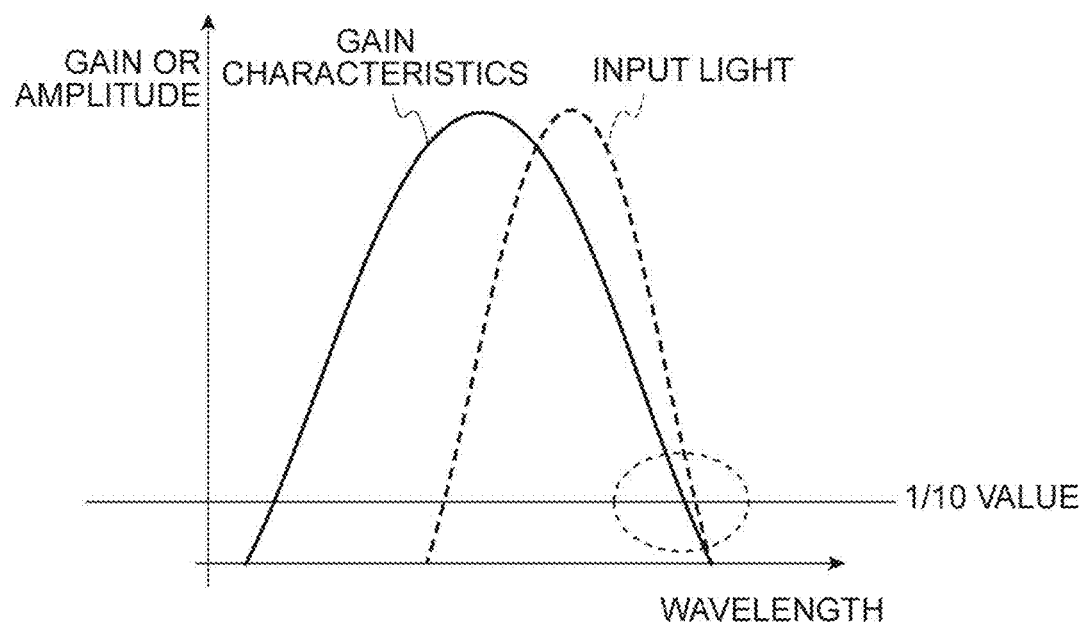
FIG. 6 is a diagram illustrating gain characteristics and an intensity of input light for each wavelength.

More specifically, the light source 131 generates incoherent light so that a wavelength on the long wavelength side of the N value (0<N<1) of the intensity distribution of the input light is longer than a wavelength on the long wavelength side of the N value of the gain characteristics. N is set to, for example, ½. In this case, as illustrated in FIG. 4, the wavelength on the long wavelength side among the wavelengths at which an amplitude (intensity) of the input light becomes a ½ value (half value) is a wavelength longer than the wavelength on the wavelength side among the wavelengths at which the gain in the gain characteristics becomes a half value. As illustrated in FIG. 6, the light source 131 may generate incoherent light so that a wavelength on the long wavelength side of a ¹⁄₁₀ value of the intensity of the input light is longer than a wavelength on the long wavelength side of a ¹⁄₁₀ value of the gain in the gain characteristics.

Figure 5:
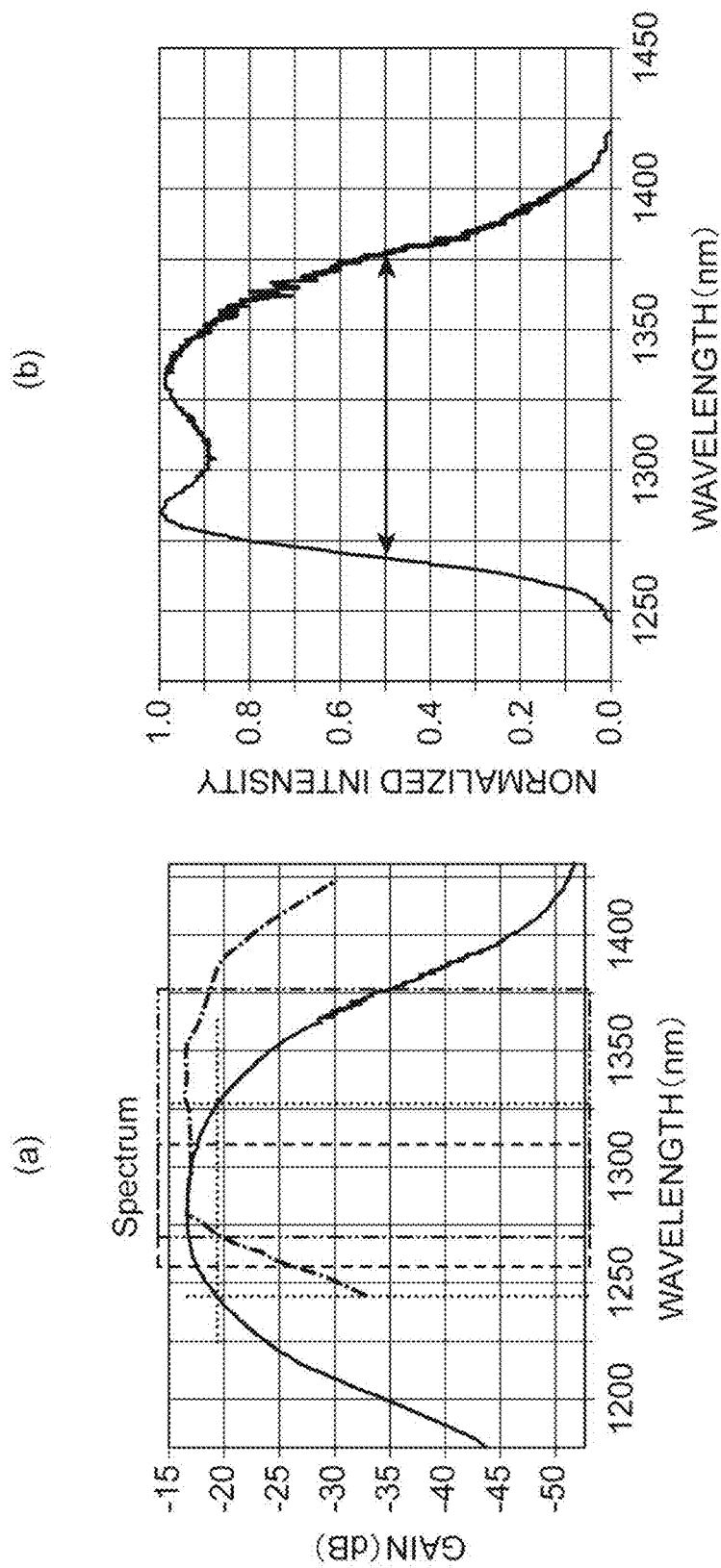
FIG. 5 is a diagram illustrating wavelength selection of input light according to gain characteristics.

Specifically, selection of a wavelength of the input light according to the gain characteristics will be described with reference to FIG. 5. FIG. 5($a$) illustrates the gain characteristics, and a wavelength width (half value width) at which the intensity of the input light becomes a ½ value. FIG. 5($b$) is a diagram illustrating a normalized intensity (amplitude) for each wavelength of the input light of the optical amplifier 132, in which a maximum value of the amplitude is illustrated as 1.0. In FIG. 5($a$), the gain characteristics are indicated by a solid line, a half value width of the gain characteristics is indicated by a dotted line, a half value width of the input light of which a central wavelength is the same as that of the gain characteristics is indicated by a dashed line, an intensity distribution for each wavelength of the input light of which the wavelength on the long wavelength side of the half value is longer than the wavelength on the long wavelength side of the half value in the gain characteristics is indicated by a dash-dotted line, and a half value width of the input light indicated by the dash-dotted line is indicated by a two-dot-dashed line.

As illustrated in FIG. 5($a$), when the input light having the same central wavelength as the gain characteristics is input to the optical amplifier 132, the gain characteristics have a portion on the long wavelength side with respect to that of the input light, when viewed in half-value width. In this case, charge having a lower energy on the long wavelength side with respect to the input light in the optical amplifier 132 becomes spontaneous emission light, and is estimated to cause noise in the light that is output from the optical amplifier 132. On the other hand, when input light in which the wavelength on the long wavelength side of the half value is longer than the wavelength on the long wavelength side of the half value in the gain characteristics is input to the optical amplifier 132, the gain characteristics do not have a portion on the long wavelength side with respect to the input light in terms of half value width. By selecting the wavelength of the excitation light (input light) in order to use all charge on the long wavelength side of the optical amplifier 132 in this way, generation of the spontaneous emission light is suppressed. As a result, it is possible to suppress noise of the amplified light output from the optical amplifier 132. For example, in FIG. 5(a), a half value width of the gain characteristics is about 80 nm between 1245 nm and 1325 nm. In this case, as illustrated in FIGS. 5(a) and 5(b), when the half value width of the input light is about 115 nm between 1260 nm to 1375 nm, for example, a wavelength on the long wavelength side of a half value of an amplitude of the input light can be made longer than the wavelength on the long wavelength side of a half value of a gain of the gain characteristics.

Figure 7:
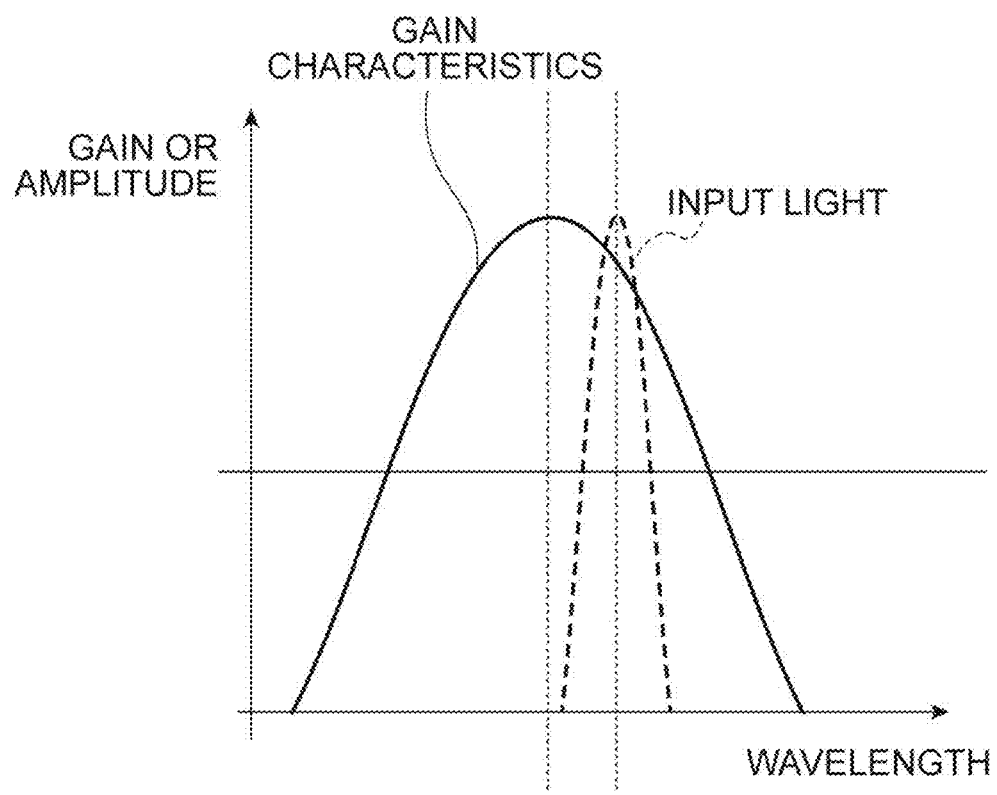
FIG. 7 is a diagram illustrating gain characteristics and an intensity of input light for each wavelength.

In the example illustrated in FIG. 5, the light source 131 causes the wavelength width of the input light to be wider than the wavelength width of the gain characteristics, but the present invention is not limited thereto. For example, as illustrated in FIG. 7, the light source 131 may generate the incoherent light so that the central wavelength of the intensity distribution of the input light is longer than the central wavelength of the gain characteristics, and the wavelength width (for example, a full width at half maximum) of the input light is narrower than the wavelength width of the gain characteristics.

Further, the saturation wavelength region in the amplified light may be wider than a wavelength region other than the saturation wavelength region. In this case, since the saturation wavelength region having an intensity in a state in which the light amplification in the optical amplifier has become saturated is wider than a non-saturation wavelength region having an intensity in a state in which the light amplification in the optical amplifier is not saturated, the noise of the amplified light is relatively reduced. In other words, the amount (a horizontal line in FIG. 8) of light that is saturated in the optical amplifier 132 is larger than the amount of light that is not saturated (an oblique line in FIG. 8). For a ratio of the amounts of the light, a ratio of the amount of light of the saturation wavelength region to the amount of light of the non-saturation wavelength region may be equal to or greater than 20 dB.

Next, operations and effects of the light source device 13 and the inspection device 1 according to this embodiment will be described.

Figure 9:
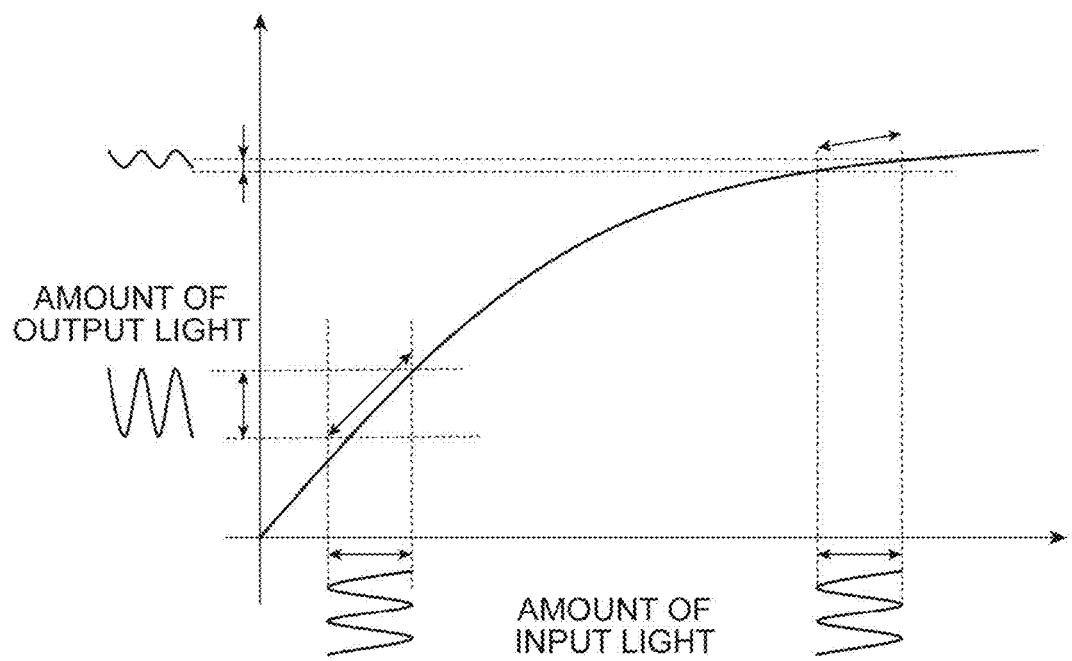
FIG. 9 is a graph illustrating input and output characteristics of a semiconductor optical amplifier.

In the light source device 13, the input light includes light with an intensity at which the optical amplifier 132 is saturated in a gain. FIG. 9 is a graph illustrating input and output characteristics of the optical amplifier 132. As illustrated in FIG. 9, in a state in which the optical amplifier 132 is saturated in a gain, the amplification characteristics of the optical amplifier 132 are nonlinear. Therefore, in a state in which the optical amplifier 132 is not saturated in a gain, the amount of change in an output including noise corresponding to an input change is great. On the other hand, in a state in which the optical amplifier 132 is saturated in a gain, the amount of change in the output including noise corresponding to the input change decreases. Accordingly, it is possible to reduce the noise included in the input light.

Further, in the light source device 13, the central wavelength of the intensity distribution for each wavelength of the input light of the optical amplifier 132 is a wavelength longer than the central wavelength of the gain characteristics indicating the gain at each wavelength of the optical amplifier 132. In the optical amplifier 132, low energy charge that does not contribute to the amplification of the input light becomes spontaneous emission light to thereby generate noise. That is, when the low energy charge on the long wavelength side that does not contribute to the amplification of the input light increases, the noise of the amplified light from the optical amplifier 132 increases. In this regard, in the light source device 13, the central wavelength of the intensity distribution of the input light of the optical amplifier 132 is a wavelength longer than the central wavelength of the gain characteristics. That is, in the light source device 13, the central wavelength of the intensity distribution of the input light of the optical amplifier 132 is longer (greater) than the central wavelength of the gain characteristics. Usually, the central wavelength of the intensity distribution of the input light of the optical amplifier 132 is set to match the central wavelength of the gain characteristics. However, thus, by setting the central wavelength of the intensity distribution of the input light to be shifted to the long wavelength side, it is easy for low energy charge on the long wavelength side in the optical amplifier 132 to be used for amplification as compared with a case in which the central wavelength of the intensity distribution of the input light of the optical amplifier 132 is set to match the central wavelength of the gain characteristics. Accordingly, it is possible to reduce the charge on the long wavelength side that does not contribute to the amplification of the input light, and it is possible to reduce the noise of the output light from the optical amplifier 132.

Figure 10:
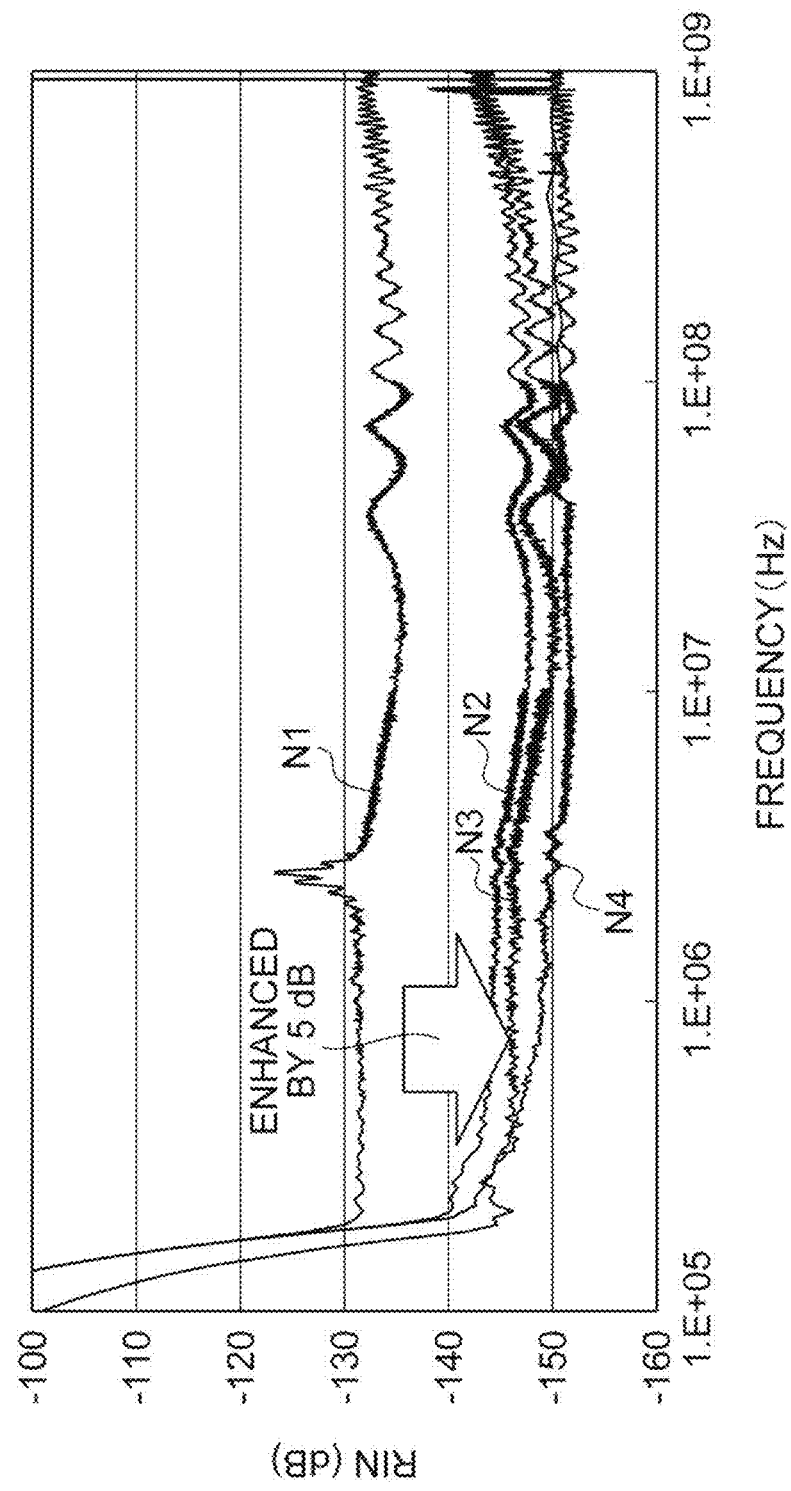
FIG. 10 is a diagram illustrating an S/N improvement effect.

FIG. 10 is a diagram illustrating an S/N improvement effect due to the light source device 13 according to this embodiment, and illustrates relative intensity noise (RIN) according to a comparative example with respect to a frequency. The RIN is a parameter indicating a temporal fluctuation of the light intensity obtained by dividing a fluctuation of the light intensity per unit frequency by an average light intensity. In FIG. 10, N1 indicates the RIN of the light source device including only an SLD, and N2 indicates the RIN of the light source device including an SLD and a semiconductor optical amplifier, which is a light source device in which the central wavelength of the intensity distribution of the input light is not adjusted. That is, N1 and N2 indicate the RINs of the light source device in which the central wavelength of the intensity distribution of the input light and the central wavelength of the gain characteristics are substantially the same. Further, N4 indicates a measurement limit of the RIN of the light source device including an SLD and a semiconductor optical amplifier. N3 indicates the RIN of the light source device including an SLD and a semiconductor optical amplifier, which is a light source device in which the central wavelength of the intensity distribution of the input light is made longer than the central wavelength of the gain characteristics. In N3, the RIN is reduced by about 5 dB as compared to N1, and the RIN can be reduced to an extent close to N4 that is the measurement limit of the RIN.

Further, the wavelength on the long wavelength side of the N value (0<N<1) of the intensity distribution of the input light is a wavelength longer than the wavelength on the long wavelength side of the N value of the gain characteristics.

Thus, since the wavelength region of the input light is set to be further shifted to the long wavelength side of the gain characteristics, it is possible to further reduce the noise of the amplified light. The N value is, for example, a ½ value (a half value) or a 1/10 value. In general, a width of the wavelength region at the ½ value of the intensity distribution of the light or the gain characteristics is referred to as a full width at half maximum.

Figure 8:
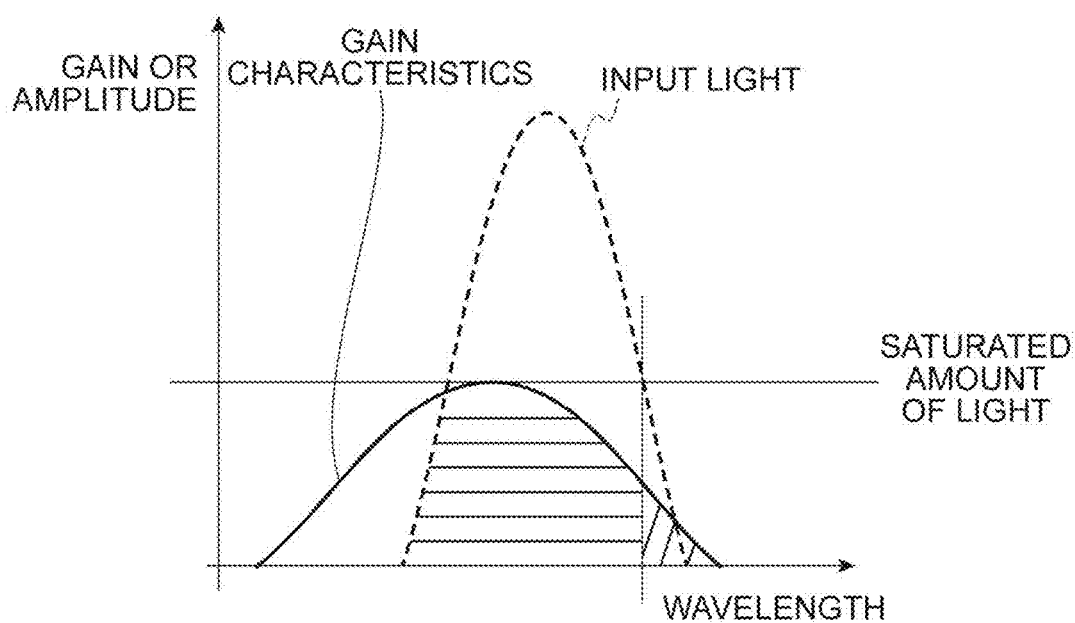
FIG. 8 is a graph illustrating gain characteristics and an intensity of input light for each wavelength.

Further, the saturation wavelength region in which the amplified light has an intensity in a state in which the amplification in the optical amplifier 132 has become saturated is a region wider than a wavelength region that is not the saturation wavelength region (see FIG. 8). Accordingly, it is possible to decrease charge that does not contribute to the amplification in the optical amplifier 132 and further reduce the noise of the amplified light.

Further, the light source device 13 includes the variable attenuator 133 (light adjustment means) that adjusts the intensity of the amplified light output from the optical amplifier 132. Thus, it is possible to obtain light with a desired intensity by freely adjusting the intensity of the amplified light amplified by the optical amplifier 132 using the variable attenuator 133.

Further, the optical amplifier 132 is a semiconductor optical amplifier. Using the semiconductor optical amplifier, it is possible to reliably cause the central wavelength of the intensity distribution of the input light to be longer than the central wavelength of the gain characteristics of the optical amplifier.

The inspection device 1 of this embodiment includes the above-described light source device 13, the optical scanner 14 that irradiates a selected region on the semiconductor device D with light emitted from the light source device 13, the tester 11 that applies a test signal to the semiconductor device D, and the optical sensor 20 that detects light reflected by the semiconductor device D to which the test signal has been applied according to the light radiated from the optical scanner 14. Thus, it is possible to apply the above-described light source device 13 to the semiconductor inspection device that inspects the semiconductor device D using optical probing, and to improve accuracy of semiconductor inspection by reducing noise of probe light.

Figure 11:
FIG. 11 is a diagram illustrating an analysis image according to a comparative example.
Figure 12:
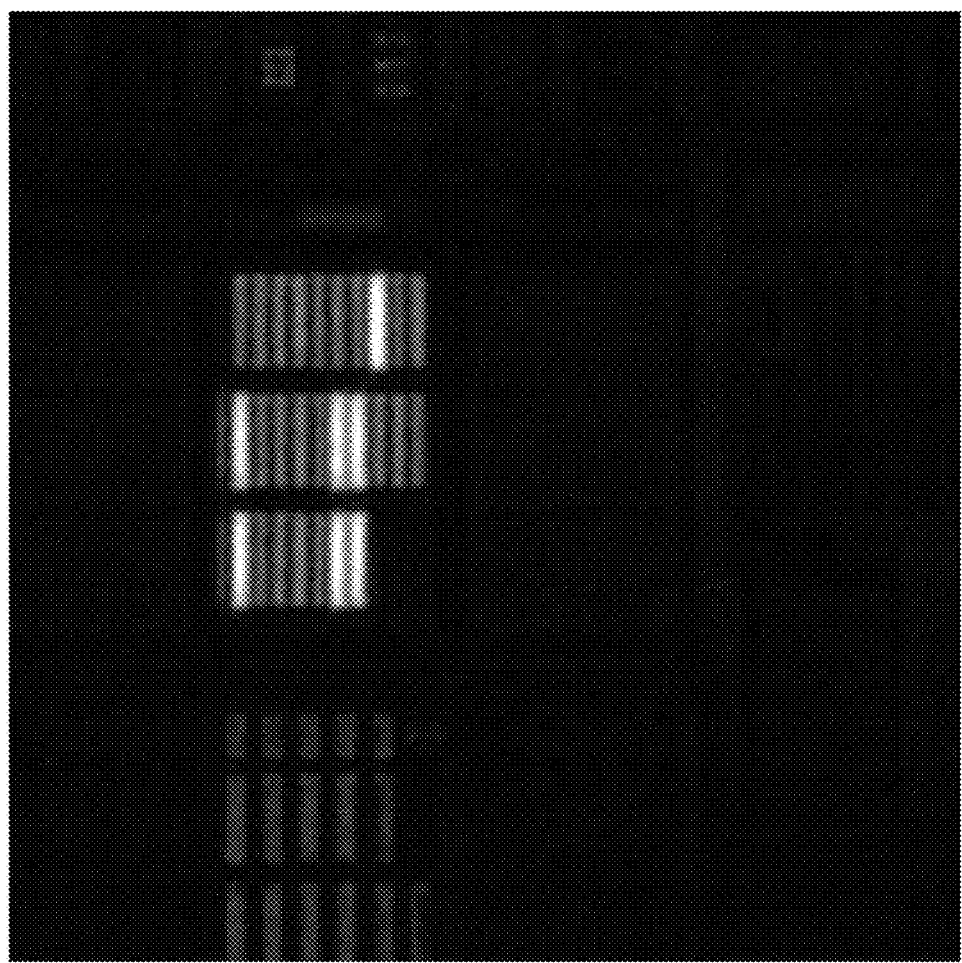
FIG. 12 is a diagram illustrating an analysis image according to this embodiment.

FIG. 11 is a diagram illustrating an analysis image of an inspection device according to a comparative example. The inspection device according to the comparative example includes a light source device including only an SLD. FIG. 12 is a diagram illustrating an analysis image of the inspection device 1 including the light source device 13. As can be seen from FIGS. 11 and 12, in the inspection device 1 that includes the light source device 13 and greatly reduces noise of amplified light output from the light source device 13, an analysis image becomes clearer and accuracy of fault analysis or the like is greatly improved.

[Second Embodiment]

Figure 13:
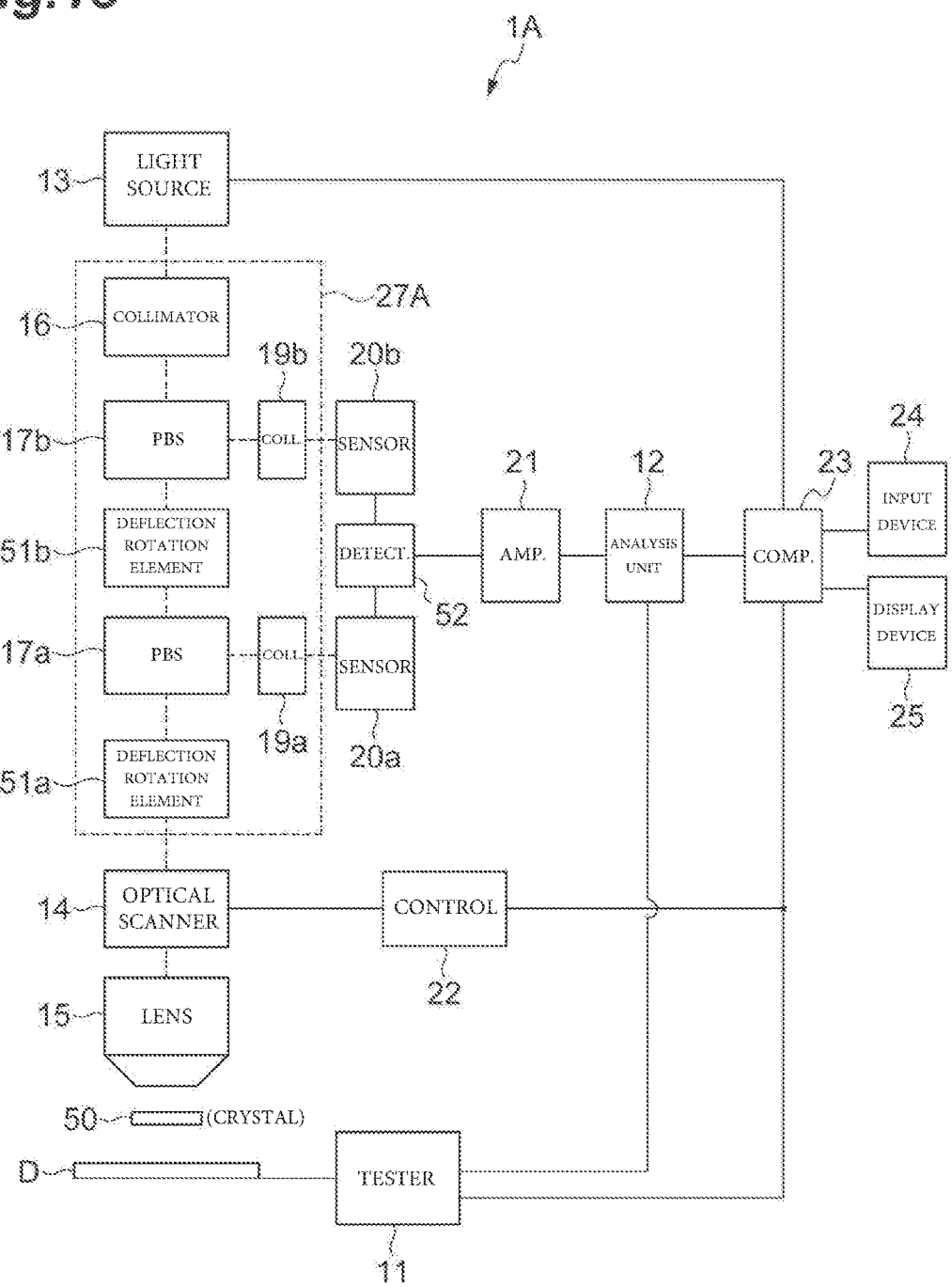
FIG. 13 is a configuration diagram of an inspection device according to a second embodiment of the present invention.

Next, an inspection device according to a second embodiment will be described with reference to FIG. 13. In description related to the second embodiment, differences between the second embodiment and the first embodiment described above will be mainly described.

An inspection device 1A according to the second embodiment specifies a fault position using a magneto-optical probing technology. As illustrated in FIG. 13, the inspection device 1A is different from the inspection device 1 according to the first embodiment in that the inspection device 1A includes a magneto-optical crystal 50, and further includes a light splitting optical system 27A, optical sensors 20a and 20b, and a differential detector 52.

The magneto-optical crystal 50 changes a polarization state of input light according to a magnetic field generated by the semiconductor device D using a magneto-optical effect. Thus, for example, when a fault occurs in the semiconductor device D, a change to a magnetic field different from a normal magnetic field due to the fault can be output as a polarization state of light. The polarization state of the light is acquired as the intensity of light by the optical sensors 20a and 20b (described below). The magneto-optical crystal 50 is arranged to face the semiconductor device D and, for example, arranged in contact with the semiconductor device D. An arbitrary place on the magneto-optical crystal 50 is irradiated with the light emitted from the light source device 13 via the light splitting optical system 27A, the optical scanner 14, and the objective lens 15. Further, light reflected by the magneto-optical crystal 50 is detected by the optical sensors 20a and 20b via the light splitting optical system 27A and the like. The optical sensors 20a and 20b detect the light from the magneto-optical crystal 50 and output the intensity of the detected light to the differential detector 52. The differential detector 52 detects the intensity of the reflected light by detecting a differential of the input light and outputs the intensity as a detection signal to the amplifier 21.

The light splitting optical system 27A includes collimators 16, 19a, and 19b, PBSs 17a and 17b, and deflection rotation elements 51a and 51b. When the magneto-optical crystal 50 is irradiated with the light from the light source device 13 via the optical scanner 14, the light from the light source device 13 is first input to the PBS 17b via the collimator 16. The PBS 17b is set to transmit light with a deflection component of 0° and reflect light with a deflection component of 90°. Further, the PBS 17b is set according to the polarization of the light from the collimator 16. Therefore, the PBS 17b transmits light from the collimator 16. The light with a polarization component of 0° transmitted through the PBS 17b is input to the deflection rotation element 51b in which a polarization plane for the input light is tilted (rotated) by 45°, and the polarization component thereof becomes that at 45°.

The light transmitted through the deflection rotation element 51b is input to the PBS 17a. The PBS 17a is set to transmit light with a deflection component of 45° and reflect light with a deflection component of 135°. Therefore, light transmitted through the deflection rotation element 51 is transmitted through the PBS 17a. The light with the deflection component of 45° transmitted through the PBS 17a is transmitted through the deflection rotation element 51a in which a polarization plane for the input light is tilted (rotated) by 22.5°, the polarization component thereof becomes that at 67.5°, and the resultant light is input to the optical scanner 14. The magneto-optical crystal 50 is irradiated with the light via the objective lens 15.

The reflected light (return light) from the magneto-optical crystal 50 is input to the deflection rotation element 51a via the objective lens 15 and the optical scanner 14. The reflected light (return light) is transmitted through the deflection rotation element 51a again, and the deflection component thereof is tilted by 22.5° and becomes that at 90°. The reflected light with the deflection component of 90° is split into light with a deflection component of 45° and light with a deflection component of 135° by the PBS 17a. The light with the deflection component of 135° is reflected by the PBS 17a and input to the optical sensor 20a via the collimator 19a. It is possible to detect a signal with "a half of the return light (reflected light)+the amount of light according to a Kerr effect" from the light. On the other hand, the light with the deflection component of 45° is transmitted through the PBS 17*a*, a polarization plane is tilted by 45° by the deflection rotation element 51, the light is converted into light with a polarization component of 90°, and the light is input to the PBS 17*b*. The light with the deflection component of 90° is reflected by the PBS 17*b* and input to the optical sensor 20*b* via the collimator 19*b*. It is possible to detect a signal with "a half of the return light (reflected light)+the amount of light according to a Kerr effect" from the light. A differential of the light detected by the optical sensors 20*a* and 20*b* is detected by the differential detector 52, and a detection signal indicating an intensity of the reflected light is output to the amplifier 21. Thus, it is possible to detect an optical signal according to the Kerr effect (the amount of rotation of polarization). Accordingly, it is possible to estimate a change in the magnetic field (magnetic field intensity) that is generated in the semiconductor device D and to detect a change to a magnetic field different from a normal magnetic field, for example, due to a fault.

Figure 14:
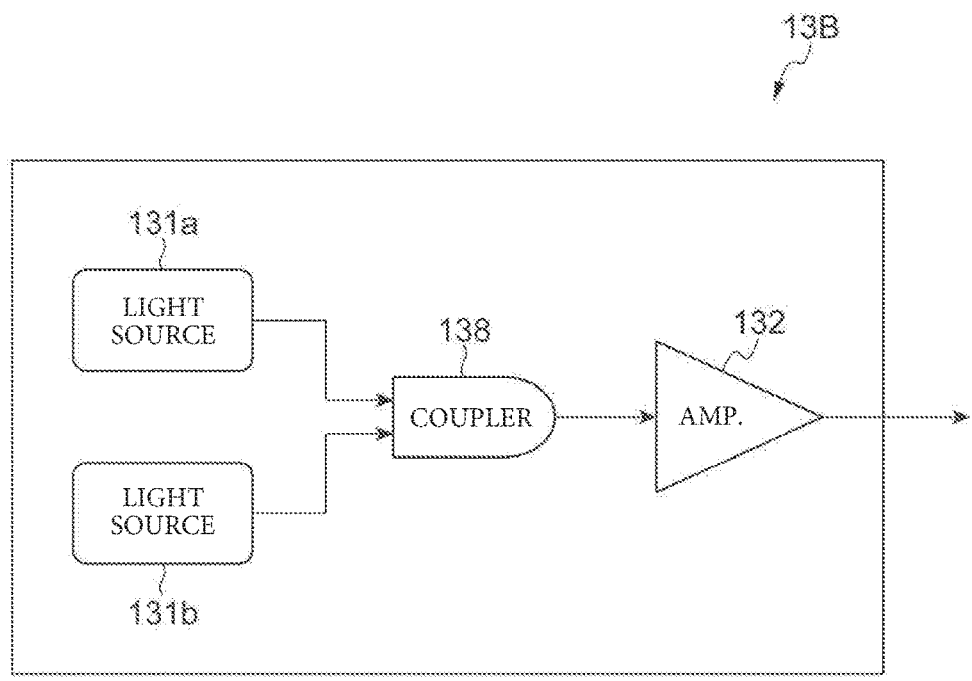
FIG. 14 is a configuration diagram of a light source device according to a modification example.
Figure 15:
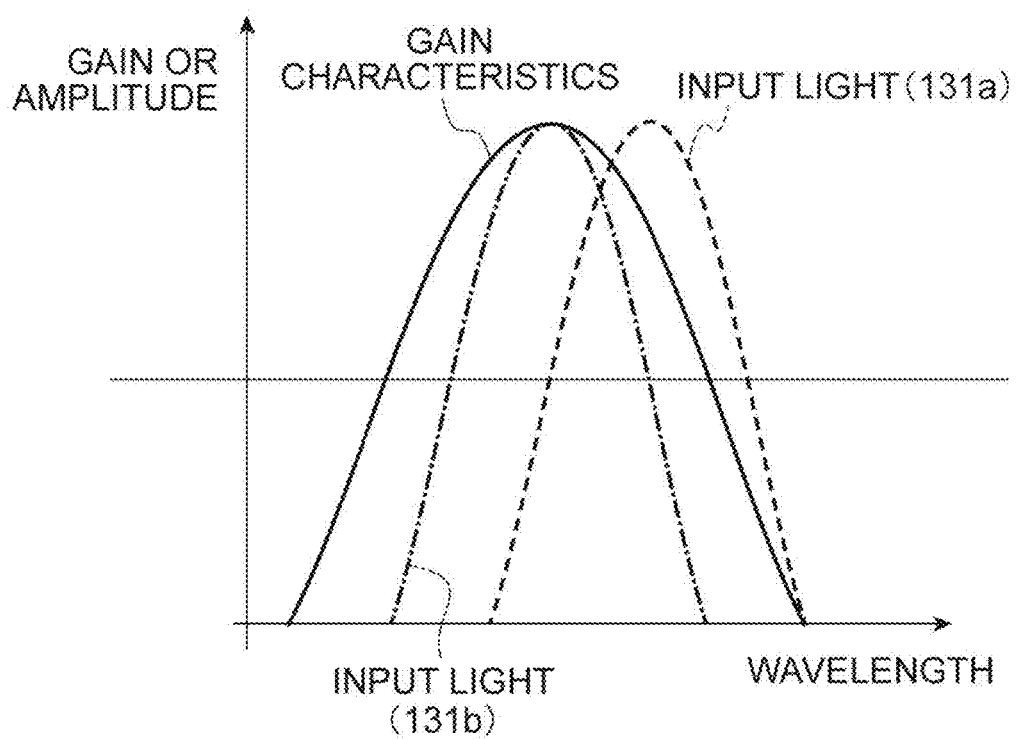
FIG. 15 is a diagram illustrating gain characteristics and a wavelength of input light in the light source device illustrated in FIG. 14.

The embodiments of the present invention have been described above, but the present invention is not limited to the above embodiments. For example, the example in which each of the number of light sources and the number of optical amplifiers is one has been described, but the present invention is not limited thereto and a configuration in which two light sources (for example, SLDs) are provided may be adopted. That is, a configuration in which each of a light source 131*a* and a light source 131*b* is optically coupled to an optical coupler 138, and the optical coupler 138 is optically coupled to the optical amplifier 132, as illustrated in FIG. 14, may be adopted. In this case, as illustrated in FIG. 15, for example, a central wavelength of an intensity distribution of input light output from the light source 131*b* and input to the optical coupler 138 is the same as the central wavelength of the gain characteristics of the optical amplifier 132, whereas a central wavelength of an intensity distribution of input light output from the light source 131*a* and input to the optical coupler 138 is longer than the central wavelength of the gain characteristics of the optical amplifier 132. Light obtained by combining the light output from the light source 131*a* with the light output from the light source 131*b* is input to the optical amplifier 132 as input light.

Figure 16:
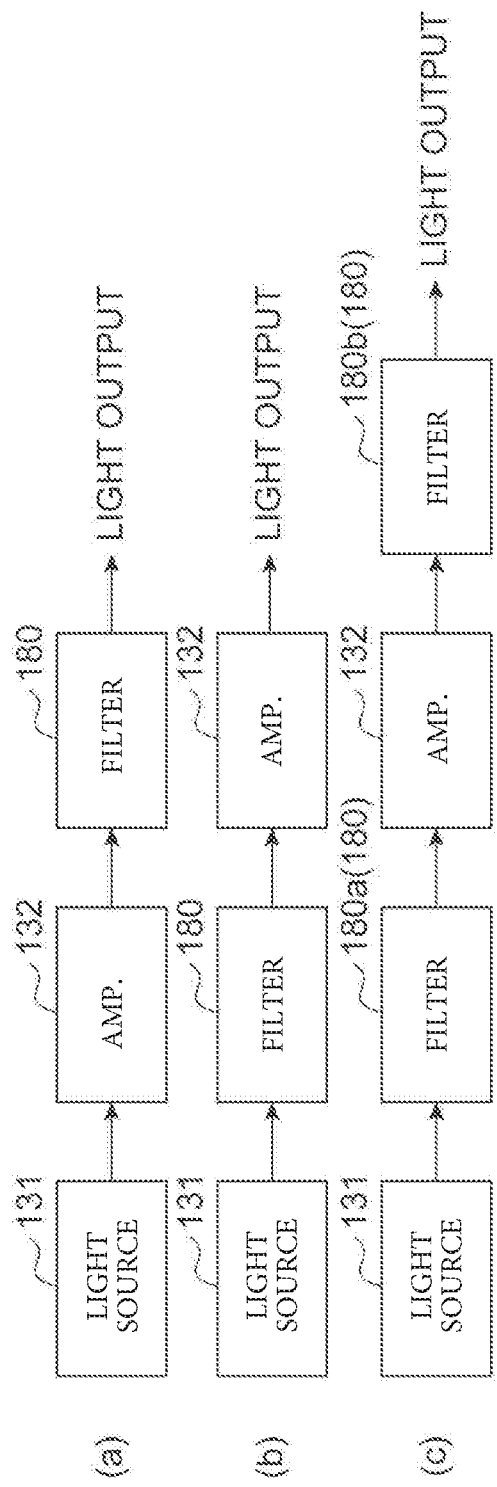
FIG. 16 is a configuration diagram of a light source device according to a modification example.

Further, the light source device may include a band eliminator filter (BEF), in addition to the light source such as an SLD, and the optical amplifier. The BEF is a filter that is optically coupled to the light source such as the SLD, and relatively widens the wavelength width by suppressing the intensity at the peak wavelength of the light output to extend a half value width (full width at half maximum). That is, the BEF has an effect of attenuating light in a selected wavelength region. As illustrated in FIG. 16(*a*), for example, the amplified light amplified by the optical amplifier 132 is input to the BEF 180. Alternatively, the light output from the light source 131 is input to the BEF 180, and the BEF 180 outputs light after attenuation to the optical amplifier 132, as illustrated in FIG. 16(*b*). Alternatively, the BEF 180 may include BEFs 180*a* and 180*b*, as illustrated in FIG. 16(*c*). The light output from the light source 131 is input to the BEF 180*a*, and the amplified light amplified by the optical amplifier is input to the BEF 180*b*.

Figure 17:
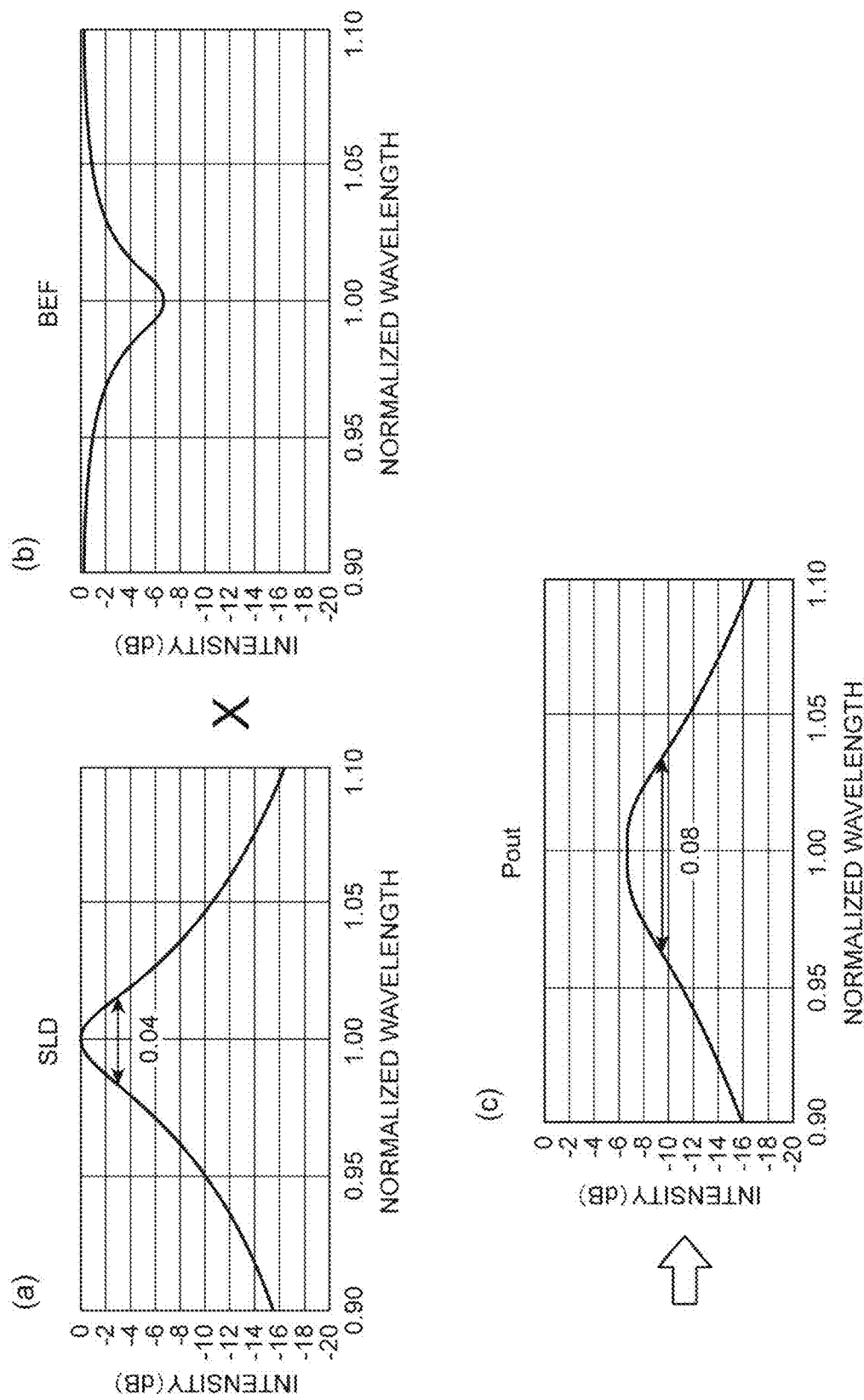
FIG. 17 is a diagram illustrating light that is output from the light source device illustrated in FIG. 16.
Figure 18:
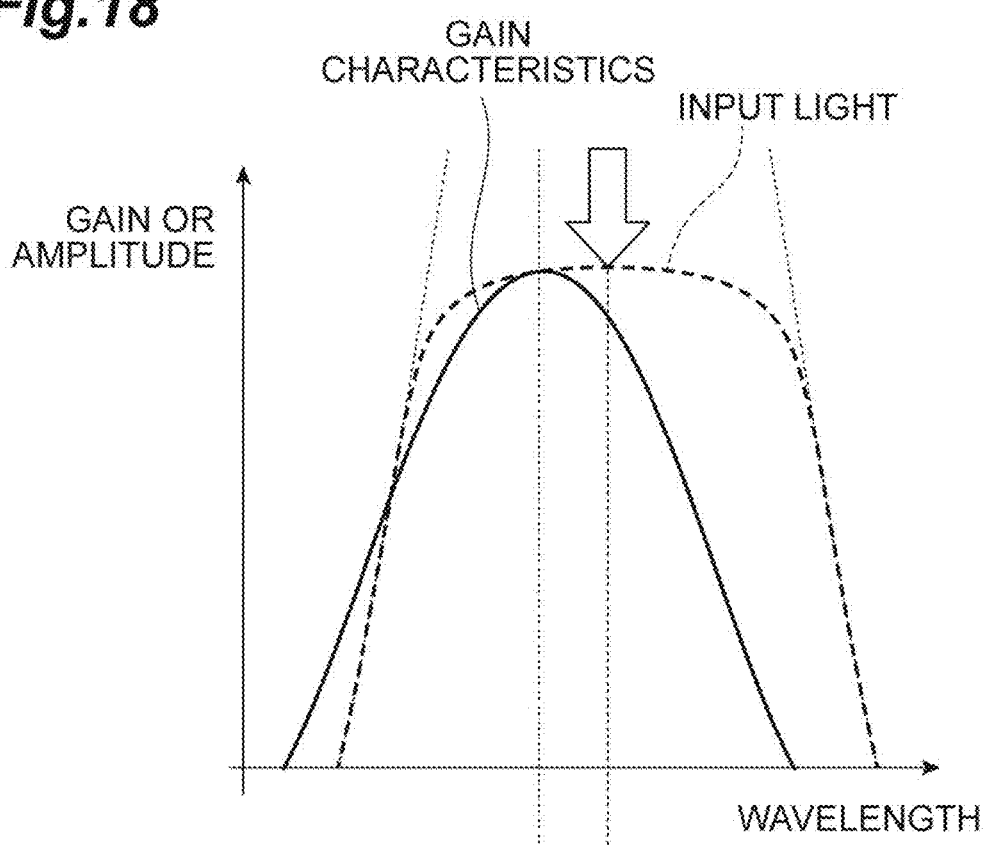
FIG. 18 is a diagram illustrating gain characteristics and an intensity of input light for each wavelength in the light source device illustrated in FIG. 16.

FIG. 17 is a diagram illustrating the light that is output from the light source device illustrated in FIG. 16(*b*). FIG. 17(*a*) illustrates an intensity with respect to each normalized wavelength of the light output from the light source 131. FIG. 17(*b*) illustrates characteristics of the BEF 180 to which the light output from the light source 131 is input, and illustrates the amount of a reduction in intensity with respect to each normalized wavelength of the input light. As illustrated in FIG. 17(*b*), the BEF 180 is set to reduce the peak value of the intensity distribution with respect to the wavelength of the light output from the light source 131. FIG. 17(*c*) illustrates light of which the peak value of the intensity distribution has been reduced (light of which a peak of the intensity distribution has been suppressed) by the BEF 180, which is input light that is input to the optical amplifier 132. By reducing the peak value using the BEF 180, a full width at half maximum of the intensity distribution in the light output from the light source 131 illustrated in FIG. 17(*a*) is 0.04, whereas a full width at half maximum of the intensity distribution in the light input to the optical amplifier 132 illustrated in FIG. 17(*c*) is 0.08. By widening the wavelength width of the input light as illustrated in FIG. 18, it becomes easy for low energy electrons on the long wavelength side of the gain characteristics of the optical amplifier 132 to contribute to the amplification.

Further, in the embodiment, the wavelength of the light generated by the light source 131 is adjusted or the light output from the light source 131 is adjusted using the BEF 180 in order to make the central wavelength of the intensity distribution indicating the intensity at each wavelength of the input light longer than the central wavelength of the gain characteristics indicating the gain at each wavelength of the optical amplifier 132. However, the present invention is not limited thereto, and the gain characteristics of the optical amplifier 132 may be adjusted by adjusting a control signal such as a current or a voltage applied to the optical amplifier 132 such that the central wavelength of the intensity distribution indicating the intensity at each wavelength of the input light is made longer than the central wavelength of the gain characteristics indicating the gain at each wavelength of the optical amplifier 132. Further, since the optical amplifier 132 is capable of adjusting the gain characteristics according to a temperature thereof, the central wavelength of the intensity distribution indicating the intensity at each wavelength of the input light may be made longer than the central wavelength of the gain characteristics indicating the gain at each wavelength of the optical amplifier 132 by adjusting the temperature of the optical amplifier 132.

Further, when the optical amplifier 132 amplifies input light input in a low temperature state, generation of noise in the amplified light can be suppressed. Thus, when the central wavelength of the intensity distribution indicating the intensity at each wavelength of the input light may be made longer than the central wavelength of the gain characteristics indicating the gain at each wavelength of the optical amplifier 132, and then, the optical amplifier 132 may be set to a low temperature state, it is possible to further suppress noise. The low temperature state refers to the optical amplifier 132 being at 0° C. (32° F.) or lower. Further, also when the optical amplifier 132 is adjusted to enter a constant temperature state, as well as the optical amplifier 132 being set to the low temperature state as described above according to a type or entity thereof, generation of noise in the amplified light can similarly be suppressed. An effect of the suppression of noise is achieved by simply suppressing heat generation caused by a driving current of the optical amplifier. Although the constant temperature is, for example, a normal temperature (20° C. to 25° C. (68° F. to 77° F.)), a temperature suitable for characteristics of each type or entity of the optical amplifier to be used may also be appropriately adopted as the constant temperature state.

The light source device adjusts the temperature of the optical amplifier by having a temperature adjustment unit (not illustrated). For example, the temperature can be adjusted by using an optical amplifier including a temperature sensor (such as a thermistor) or a temperature adjustment element (such as a Peltier element) as the temperature adjustment unit. When such an optical amplifier is used, the temperature of the optical amplifier is output from the thermistor to the computer 23, and a current or a voltage is applied to the Peltier element so that the temperature becomes a desired temperature. Thus, the temperature of the optical amplifier can be adjusted. The temperature adjustment element may be an element other than a Peltier element or may be configured using a circulation-type water-cooler, a heater, or the like. Further, the temperature adjustment unit may be configured to be partially separate from the optical amplifier.

Figure 19:
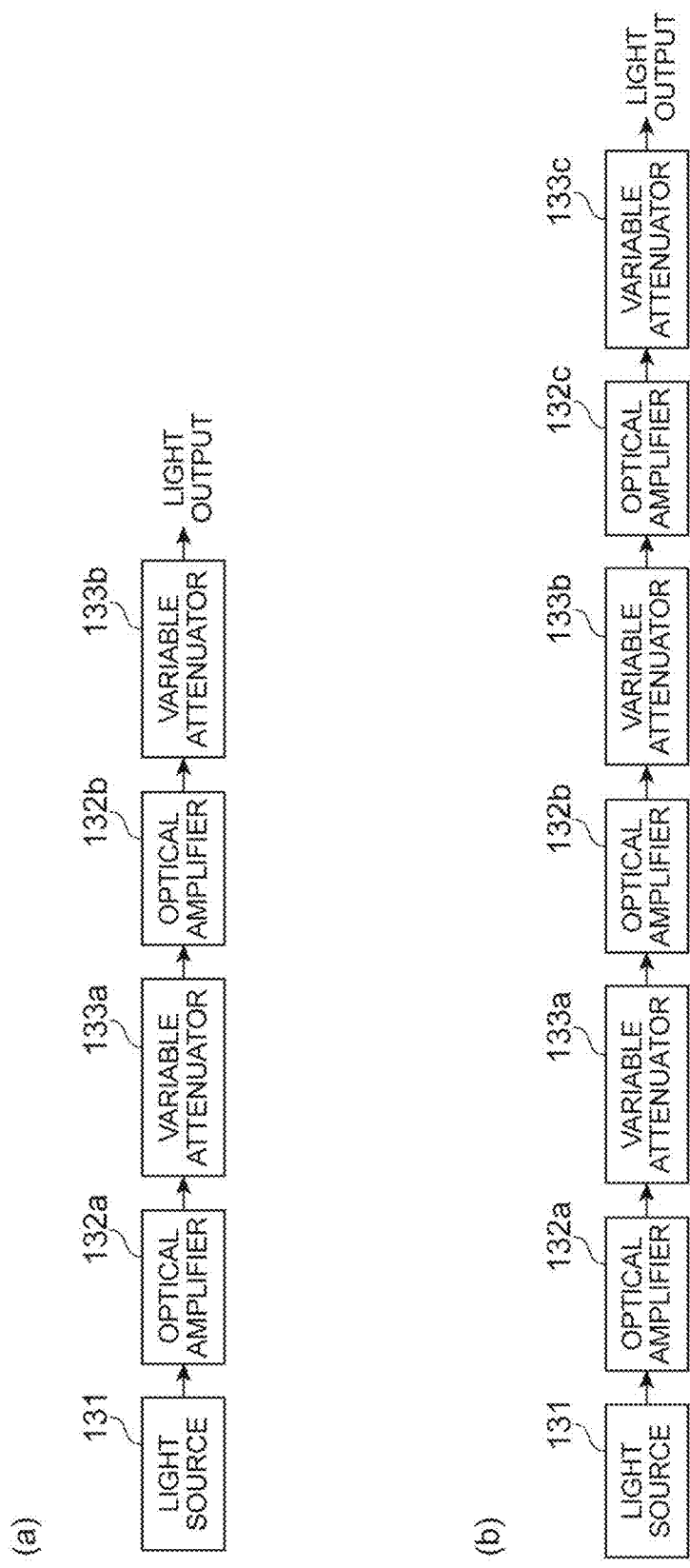
FIG. 19 is a configuration diagram of a light source device according to a modification example.

Further, the light source device in the present invention may include a plurality of optical amplifiers or may include a plurality of light adjustment means (variable attenuators). For example, light output from the light source 131 may be amplified by two optical amplifiers including an optical amplifier 132a and an optical amplifier 132b, as in a configuration of a light source device illustrated in FIG. 19(a), such that noise on a high frequency side of light finally output from the light source device can be further reduced. Further, by arranging a variable attenuator 133a between the optical amplifier 132a and the optical amplifier 132b as illustrated in FIG. 19(a), the light output from the optical amplifier 132a can be adjusted to have an optimal light intensity for reducing noise in the optical amplifier 132b and input to the optical amplifier 132b. The light output from the optical amplifier 132b is input to a variable attenuator 133b. Although FIG. 19(a) illustrates the light source device using two optical amplifiers and two variable attenuators, the light source device may be configured using three optical amplifiers and three variable attenuators, as in FIG. 19(b). That is, optical amplifiers 132a, 132b, and 132c may be included, a variable attenuator 133a may be arranged between the optical amplifier 132a and the optical amplifier 132b, a variable attenuator 133b may be arranged between the optical amplifier 132b and the optical amplifier 132c, and light output from the optical amplifier 132c may be input to a variable attenuator 133c.

Further, the light source device 13 according to an aspect of the present invention is not limited to an inspection device that inspects a semiconductor device and may be applied to other uses such as a microscope device that observes a biological specimen or an industrial product.

REFERENCE SIGNS LIST 1, 1A Inspection device
11 Tester (signal application unit)
13 Light source device
14 Optical scanner (irradiation optical system)
20, 20a, 20b Optical sensor (light detection unit)
50 Magneto-optical crystal
131, 131a, 131b Light source
132, 132a, 132b, 132c Optical amplifier
133, 133a, 133b, 133c Variable attenuator (light adjustment means)
180 BEF (filter)
D Semiconductor device

The invention claimed is:

1. An inspection device for inspecting a semiconductor device using optical probing, the inspection device comprising:
a light source device comprising:
a light source configured to generate incoherent light; and
an optical amplifier configured to have gain characteristics indicating a gain at each wavelength, the optical amplifier configured to receive the incoherent light as input light and to output amplified light obtained by amplifying an intensity of the input light,
wherein a central wavelength of an intensity distribution indicating the intensity at each wavelength of the input light is a wavelength longer than a central wavelength of the gain characteristics;
an optical system configured to receive the amplified light output from the light source device and irradiate a selected region on the semiconductor device with the amplified light; and
a light detector configured to receive the amplified light reflected from the semiconductor device and output a detection signal.

2. The inspection device according to claim 1, wherein the amplified light comprises a saturation wavelength region having art intensity in a state in which light amplification in the optical amplifier has become saturated.

3. The inspection device according to claim 2, wherein the saturation wavelength region in the amplified light is wider than a wavelength region that is not a saturation wavelength region.

4. The inspection device according to claim 1, wherein a wavelength on a long wavelength side of an N value (0<N<1) of the intensity distribution is a wavelength longer than a wavelength on the long wavelength side of the N value of the gain characteristics.

5. The inspection device according to claim 1, wherein the light source device further comprises:
a filter configured to receive the incoherent light output from the light source and reduce a peak value of the intensity distribution for a wavelength of the incoherent light output from the light source.

6. The inspection device according to claim 1, wherein the light source device further comprises:
a light adjuster configured to adjust the intensity of the amplified light.

7. The inspection device according to claim 1, wherein the optical amplifier is a semiconductor optical amplifier.

8. The inspection device according to claim 1, wherein the light source device further comprises:
a plurality of optical amplifiers.

9. The inspection device according to claim 1, wherein the light source device further comprises:
a temperature adjuster configured to adjust a temperature of the optical amplifier.

10. The inspection device according to the claim 1, further comprising:
a signal application unit configured to apply a test signal to the semiconductor device; and
an analyzer configured to receive the detection signal and analyze the detection signal.

11. An inspection device for inspecting a semiconductor device using magneto-optical probing, the inspection device comprising:

a magneto-optical crystal arranged to face the semiconductor device;
a light source device comprising:
   a light source configured to generate incoherent light; and
   an optical amplifier configured to have gain characteristics indicating a gain at each wavelength, the optical amplifier configured to receive the incoherent light as input light and to output amplified light obtained by amplifying an intensity of the input light,
wherein a central wavelength of an intensity distribution indicating the intensity at each wavelength of the input light is a wavelength longer than a central wavelength of the gain characteristics;
an optical system configured to receive the amplified light output from the light source device and irradiate a selected region on the magneto-optical crystal with the amplified light; and
a light detector configured to receive the amplified light reflected from the magneto-optical crystal and output a detection signal.

\* \* \* \* \*